United States Patent
Dultz et al.

(10) Patent No.: US 6,393,448 B1
(45) Date of Patent: May 21, 2002

(54) OPTICAL RANDOM-NUMBER GENERATOR BASED ON SINGLE-PHOTON STATISTICS AT THE OPTICAL BEAM SPLITTER

(75) Inventors: Wolfgang Dultz; Eric Hidlebrandt, both of Frankfurt am Main (DE)

(73) Assignee: Deutsche Telekom AG, Bonn (DE)

( * ) Notice: Subject to any disclaimer, the term of this patent is extended or adjusted under 35 U.S.C. 154(b) by 0 days.

(21) Appl. No.: 09/284,178

(22) PCT Filed: Sep. 17, 1997

(86) PCT No.: PCT/EP97/05082

§ 371 Date: Jun. 14, 1999

§ 102(e) Date: Jun. 14, 1999

(87) PCT Pub. No.: WO98/16008

PCT Pub. Date: Apr. 16, 1998

(30) Foreign Application Priority Data

Oct. 10, 1996 (DE) .......................................... 196 41 754

(51) Int. Cl.[7] ................................................. G06F 1/02
(52) U.S. Cl. ........................................ 708/250; 708/255
(58) Field of Search ................................. 708/250, 251, 708/252, 253, 254, 255, 256

(56) References Cited

U.S. PATENT DOCUMENTS 4,833,633 A 5/1989 Morris

OTHER PUBLICATIONS

** Manfred Richter, "A noise generator for obtaining quasi–ideal random numbers for stochastic simulation", Dissertation RWTH Aachen (1992).

** Martin Gude, "A quasi–ideal uniform distribution generator based on random physical phenomena", Dissertation RWTH Aachen (1987).

*Primary Examiner*—Chuong Dinh Ngo
(74) *Attorney, Agent, or Firm*—Kenyon & Kenyon

(57) ABSTRACT

A random-check generator for generating a random number, which is preferably represented in binary form, having a particle source, a random-check generating element which acts on particles emitted by the particle source, and a detection system which allocates a numerical value, preferably in binary form, to the detection of a particle emerging from the random-check generating element. The random-check generator is not susceptible to external interference and delivers high-quality random numbers. To that end, the particle source can emit at least two particles substantially simultaneously, and one particle can activate the detection system in order to detect a further particle influenced by the random-check generating element and allocate a numerical value thereto.

16 Claims, 4 Drawing Sheets

OPTICAL RANDOM-NUMBER GENERATOR BASED ON SINGLE-PHOTON STATISTICS AT THE OPTICAL BEAM SPLITTER

FIELD OF THE INVENTION

The invention relates to a random-number generator.

RELATED TECHNOLOGY

The generation of random numbers is more important today than ever before. The quality of random numbers plays a considerable, and possibly even a key role, not only in electronic check cards, in smart master-key systems, but also in the on-line accessing of databases. Apart from the constantly increasing quantity of random numbers required, it is also necessary to ensure that externally accessible correlations or possibilities of decryption are reduced to a minimum.

To date, essentially two different classes of method have been used for generating random numbers:

1. Algorithmic Methods

With these methods, a short initial sequence ("seed") is used to generate a considerably longer pseudo-random sequence with the aid of mathematical operations which can be executed in software or hardware. The random-number generators based on this method differ very greatly in quality and frequently do not satisfy cryptographic requirements. However, they are capable of supplying reproducible random numbers, which may be extremely useful for simulation purposes.

2. Physical Methods

With these methods, use is made of the statistical nature of certain physical processes. Generally, these processes can be further subdivided into:

Statistical processes which, although they obey deterministic equations of motion, are not predictable owing to their high degree of complexity and lack of knowledge of the initial state.

Fundamentally random processes (elementary processes) of the kind predicted by quantum mechanics. As science stands at present, these processes cannot be reduced to hypothetical deterministic mechanisms at subquantum level and are therefore basically random in nature.

Bit strings that are generated by physical processes, particularly by fundamentally random physical processes, more closely approach the concept of a random sequence than do algorithmically generated sequences. Consequently, it was recognized at an early date that, for example, radioactive decay measurements are very well suited for generating random sequences; see MARTIN GUDE: "A quasi-ideal uniform-distribution generator based on random physical phenomena", dissertation at RWTH Aachen (1987). A disadvantage in this regard, however, is the potentially detrimental effect of radioactive radiation on humans and on sensitive electronic equipment.

Other random-number generators use physical noise sources, such as semiconductor diodes, to generate random bit sequences; see, for example, MANFRED RICHTER: "A noise generator for obtaining quasi-ideal random numbers for stochastic simulation", dissertation at RWTH Aachen (1992). With these methods, however, it is often difficult to set the decision-making threshold (between bit value 0 and bit value 1) precisely and invariably with respect to time. Furthermore, for cryptographic applications it is very important to exclude external influences on the random mechanism; this is not easy to achieve especially when electronic phenomena are used.

The random process of the path selection of individual photons at the beam splitter has already been proposed for generating random sequences: see J. G. RARITY et al.: "Quantum random-number generation and key sharing", J. Mod. Opt. 41, p. 2435 (1994), which is hereby incorporated by reference herein. However, the random nature of the output sequence can be interfered with by spurious external pulses, as well as by incorrect counting of the photon detectors.

Individual photons do not divide at the optical beam splitter, but randomly and unpredictably take one of the two possible paths. Photon detectors in the outputs of the beam splitter therefore generate a random sequence, whose quality is based on the fundamental natural laws of quantum mechanics. However, a disadvantage of the method lies in the fact that spurious pulses of the detectors caused by external influences, for example by cosmic radiation, and not attributable to the random-number-generating mechanism at the beam splitter are also included in the random sequence. In principle, it would be possible for someone to selectively falsify the random sequence by subjecting the set-up to electromagnetic rays or particles.

SUMMARY OF THE INVENTION

Therefore, an object of the present invention is to provide a random-number generator which is capable of obviating or reducing the above-described disadvantages, which is not susceptible to external interference, and which supplies random numbers of high quality.

The present invention provides a random-number generator for generating a random number, the random-number generator comprising a particle source capable of emitting at least a first and a second particle more or less simultaneously; a random-number-generating element acting on particles emitted by the particle source; and a detection apparatus for associating a numerical value with a detection of a particle leaving the random-number-generating element, the first particle being capable of activating the detection apparatus so as to detect the second particle and associate a numerical value with the second particle, the second particle being influenced by the random-number-generating element.

Since the particle source according to the present invention is capable of emitting at least two particles more or less simultaneously, with one particle activating the detection apparatus, it is thereby possible for undesired background influences to be virtually entirely prevented. Since the time after activation/triggering of the detection apparatus by the first particle may be so short that essentially only the second particle to have passed through the random-number-generating element is used for generating the binary number (or if the detection apparatus is switched to the deactivated state after detection of the second particle), incorrect measurements are possible only during the very short activated/triggered state or as a result of incorrect triggering. Even in these cases, however, there is an extremely high probability that no errors will occur with the preferred embodiment according to the present invention using an optical beam splitter, because single incorrect triggering would not result in the detection of a second particle or, otherwise with correct triggering in both branches of the beam splitter, a signal would be obtained which can easily be corrected by electronic means.

It is especially advantageous if the particle source includes a photon-pair source for simultaneously generating two photons with correlated polarization, energy and spatial emission distribution, because this makes it possible, due to the already known propagation path, to substantially block out any still existing background radiation using shutters, by the known polarization technique using a polarizer and by a spectral filter.

The operation of the random-number-generating element is further improved if its outputs are associated with two receivers detecting single photons, because the clear proof of a single photon is then able to rule out any remaining uncertainty about the detected photon.

Electronically, the concept of the present invention can be captured in the detection apparatus using combined coincidence/anticoincidence electronics.

Any remaining errors of a beam splitter or of its adjustment, as often occur, can be further suppressed if the random-number-generating element contains a polarizing beam splitter and preferably an upstream $\lambda/2$ retardation plate for adjusting the overall splitting ratio.

With an optimally adjusted arrangement of beam splitter and $\lambda/2$ retardation plate, future detrimental influences in a mechanical respect can be alleviated in that at least those two assemblies and preferably the associated detectors are jointly held in positions aligned with respect to each other.

In a cost-effective embodiment, the random-number-generating element may comprise a non-polarizing beam splitter, preferably a vacuum-evaporation-coated (metallized) plate and/or a dielectric layer. Also, with this embodiment, it is possible to achieve optimal results if adjustable masks and/or tunable spectral filters are placed in the outputs of the beam splitter in order to balance the optical path and the detection electronics.

BRIEF DESCRIPTION OF THE DRAWINGS

Hereinbelow, the present invention is further elucidated on the basis of preferred embodiments with reference to the drawings, in which.

DETAILED DESCRIPTION

Figure 1:
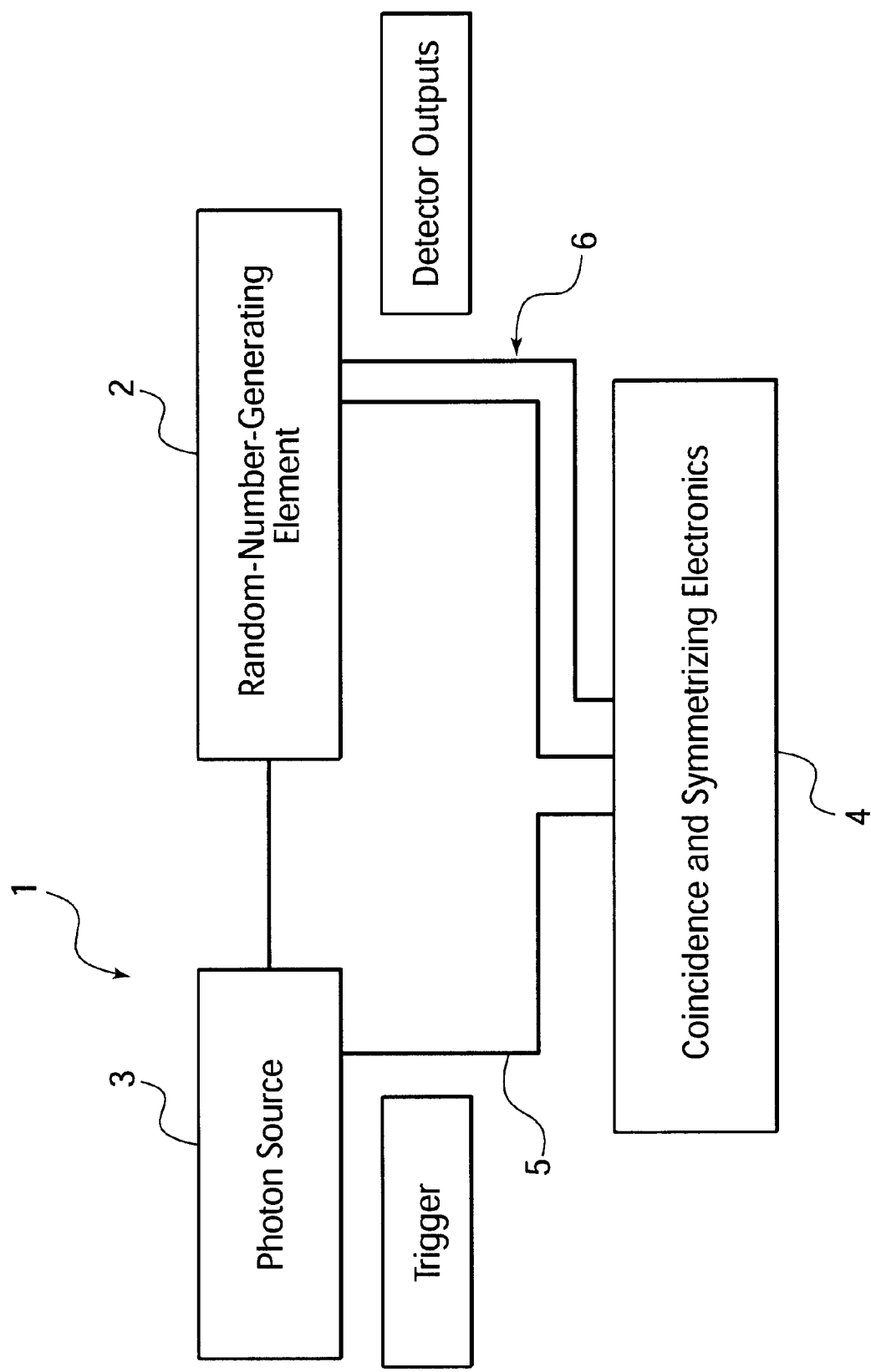
FIG. 1 shows the basic construction of a random-number-generating apparatus according to the invention.

In the following, the present invention is described in its basic features with reference to the schematic representation in FIG. 1.

The device according to the present invention, identified in its entirety by reference character 1, comprises a laser as photon source 3, a random-number-generating element 2 and coincidence and symmetrizing electronics 4, which can be activated or triggered by trigger lines 5 and which then receive the signal of the detector outputs 6.

Figure 2:
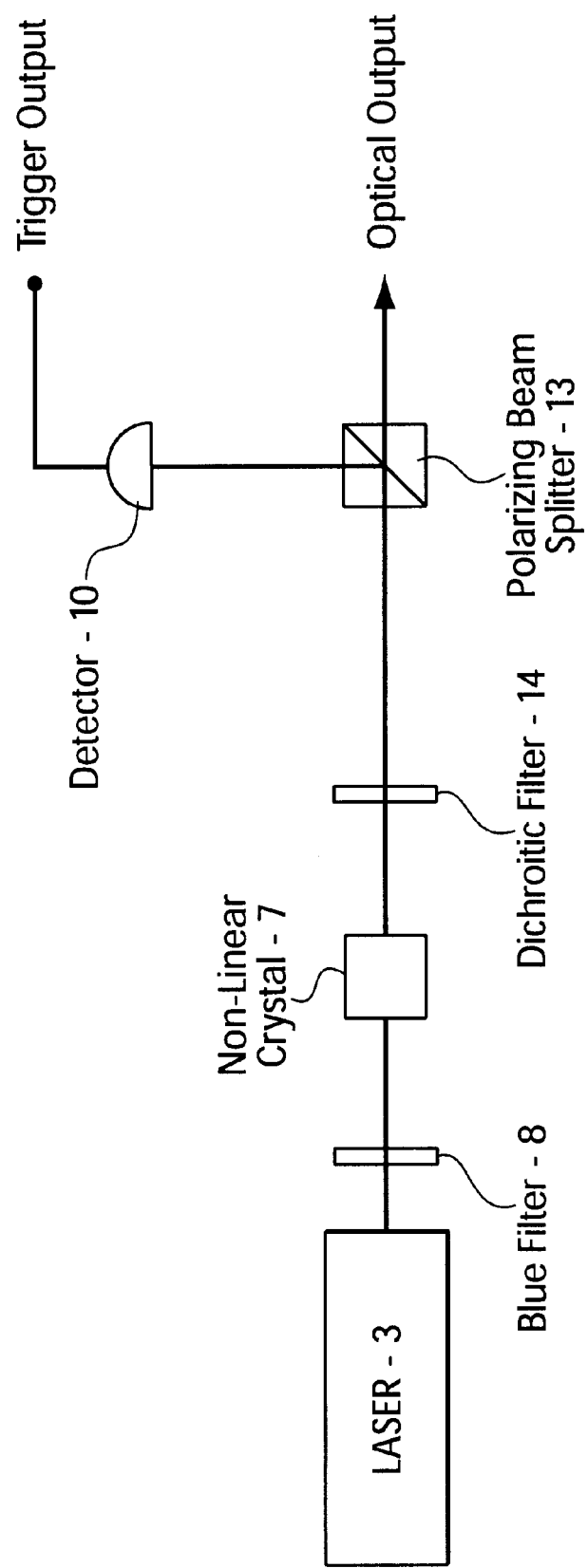
FIG. 2 shows a first embodiment according to the present invention of a photon-pair source including a laser.

Referring additionally to FIG. 2, the present invention employs a photon source in which two photons at a time are generated simultaneously in a non-linear optical medium, preferably a crystal 7. Examples of suitable optical, non-linear crystals are $BaB_2O_4$, $KNbO_3$ or $LiNbO_3$, which can be pumped with the laser 3 such that pairs of correlated photons of double wavelength polarized orthogonally with respect to each other are generated. Physically, this effect is also known as type 2 parametric fluorescence.

The laser 3 may be, for example, an He—Cd laser used at an operating wavelength of 442 nm, which produces photons in the infrared range at 884 nm. A blue filter 8, acting as spectral filter, is used to block off the plasma light emission of the laser 3 in front of the crystal, and a spectral filter or prism (not shown in the figures) behind the crystal serves to keep the pumping light of the laser 3 away from the further optical path. Each photon pair is spatially divided, one photon striking a beam splitter 9 (best seen in FIG. 4) acting as random-number-generating element, while the other photon is detected directly by the trigger detector 10.

In a detection apparatus (not shown in the figures), which also contains the coincidence and symmetrizing electronics 4, only one of the detectors 11, 12 is read out when the trigger detector 10 supplies a signal simultaneously or after a timed interval.

The detectors 10, 11 and 12 may be single-photon detectors, for example Si avalanche photodiodes of the kind supplied by EG&G as type C30902, and are in such a case operated cooled by a Peltier cooler preferably at −30° C. An achromatic lens (not shown in the figures) can focus the light beam on the detector and increase the received intensity.

The herein proposed method for the generation of random bit strings employs a fundamental random phenomenon, namely the stochastic division of a stream of single-photon states at the 50:50 beam splitter with downstream single-quantum detection.

The correlation of the counting events of the detectors 11 and 12 of the beam splitter 9 with the signal of the trigger detector 10 improves the random sequence and protects against external interference in the optical path.

Figure 3:
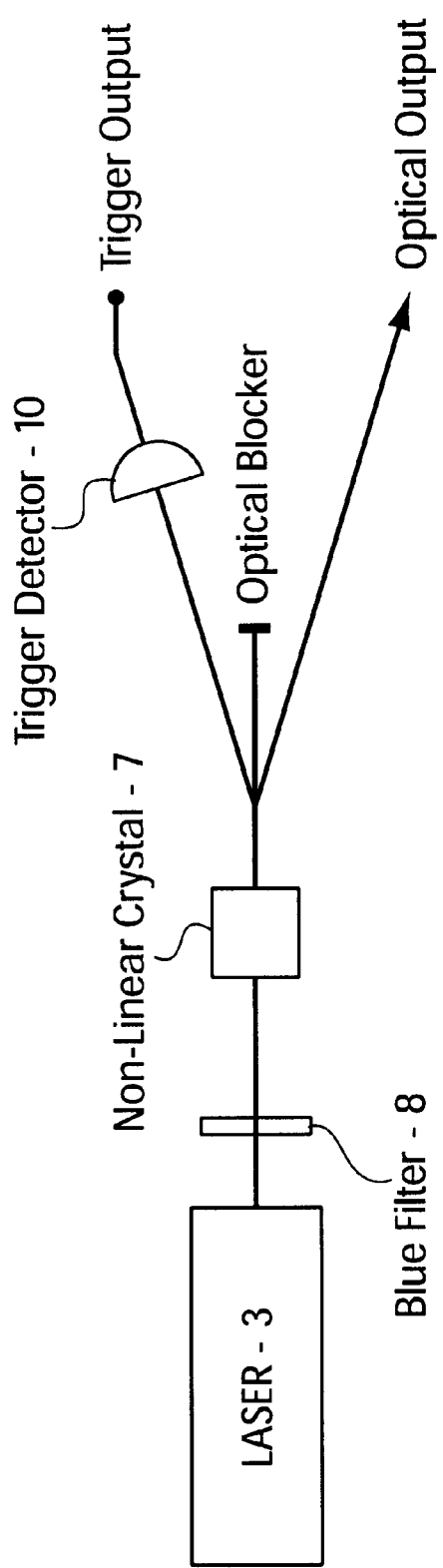
FIG. 3 shows a second embodiment according to the present invention of photon-pair source including a laser.

According to the present invention, at least two different optical set-ups can be used: the colinear set-up shown in FIG. 2 and the non-colinear set-up shown in FIG. 3, in which the optical paths are at an angle with respect to each other.

In the non-colinear set-up in FIG. 3, the photons are separated already as they are produced in the non-linear crystal 7 in that they propagate in different directions. The two photons of a pair are then already spatially separated and, moreover, their directions of propagation do not coincide with that of the laser. Consequently, it is possible, in comparison with the colinear set-up in FIG. 2, to economize on some of the optical components, particularly the polarizing beam splitter 13, and the optical losses are correspondingly smaller.

In the set-up in FIG. 3, the photons of a pair do not need to have different directions of polarization and, consequently, it is possible to use type 1 parametric fluorescence, which provides additional flexibility in the optimization of the photon rate since the efficiencies of the type 1 and type 2 processes may differ depending on the sort of crystal used.

Figure 4:
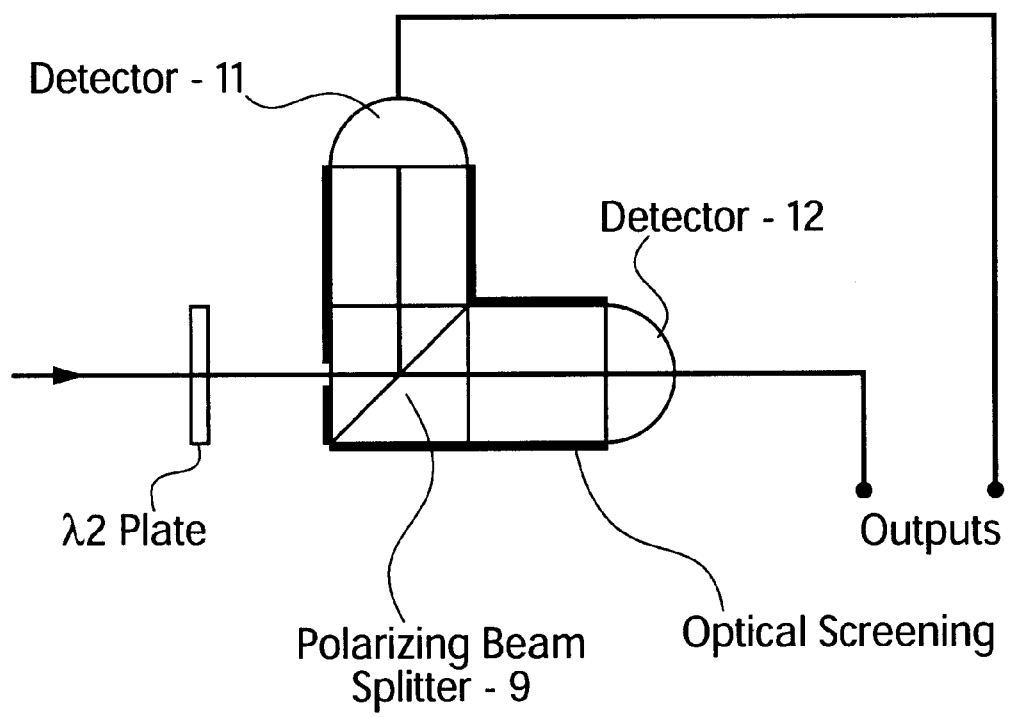
FIG. 4 shows a random-number-generating element, with associated detectors, according to the present invention.

The construction of the random-number-generating element 2 is shown in greater detail in FIG. 4. In a first embodiment according to the invention, the random number-generating element comprises a polarizing 50:50 beam splitter 9 with single-photon detectors 11, 12 in the outputs thereof and with an optional computer-controlled rotatable $\lambda/2$ retardation plate in the input. Through the rotation of said $\lambda/2$ plate it is possible for the overall splitting ratio, which, because of the component tolerances in the detectors, would generally differ from 50:50, to be set to better than 0.1% deviation from the ideal value.

The input end of the beam-splitter cube 9 is covered by a pinhole diaphragm except for an opening of 2 mm diameter.

Furthermore, the unused input of the beam splitter is covered, and the optical paths to the detectors 11, 12 are optically sealed against background light.

Instead of the polarizing beam splitter 9, it is possible in an alternative embodiment according to the present invention, to also employ a non-polarizing beam splitter configured, for example, from a vacuum-evaporation-coated plane-parallel or wedge-shaped plate. The said vacuum-evaporation coating may be metallic or dielectric. Any deviations from the 50:50 ratio in the optical set-up or the electronics can be compensated downstream from the beam splitter by masks or spectral filters.

A detection apparatus, which may be connected to a PC and which may supply said PC with binary data or data in any other form, comprises the coincidence and symmetrizing electronics 4, which is supplied with the output signals of the detectors 11 and 12 as well as of the trigger detector 10. In the simplest case, an AND gate with a time delay in one of the inputs is used for this purpose. The output signals of the two coincidence units generate provisional bit values "1" and "0".

In order to further restrict the influence of undesired light and detector dark counting rates, the output signals of the coincidence units are used to generate, by means of an EXOR gate, an "event" signal which is only "HIGH" when there is a coincidence between the trigger detector 10 and precisely one of the two output detectors 11, 12.

In order to generate a completely uniform "0–1" sequence, the output signal is additionally symmetrized using a hardware version of the "von Neumann algorithm"; see, for example, J. von Neumann "Various Techniques Used in Connection with Random Digits", Appl. Math. Ser., 12, pages 36–38 (1951). With this algorithm, the original sequence is first divided into non-overlapping pairs of consecutive bits and, from those pairs, the output sequence is then generated according to the following rule:

| Bit 1 | Bit 2 | Output bit |
|---|---|---|
| 1 | 1 | — |
| 1 | 0 | 1 |
| 0 | 1 | 0 |
| 0 | 0 | — |

Although this method has the disadvantage of an at least 75% reduction in the maximum achievable bit rate, it guarantees a precise 50:50 distribution of the "0"s and "1"s without including undesired correlations, which is difficult to accomplish with other methods that have lower bit rate losses.

The values thus obtained are stored intermediately in a buffer memory and are then transferred to a control computer or PC.

In order to maintain an adjustment, once made, stable, the device according to the present invention and its optical and optoelectronic elements may be built on a separate carrier, such as a two-dimensional optical bench or a mechanically worked block of metal or ceramics. In addition, it lies within the scope of the present invention, once miniature-sized lasers with suitable spectra are available, to implement the random-number generator in an integrated-optoelectronic form.

What is claimed is:

1. A random-number generator for generating a random number, the random-number generator comprising:

a particle source capable of emitting at least a first and a second particle more or less simultaneously;

a random-number-generating element acting on particles emitted by the particle source; and a detection apparatus for associating a numerical value with a detection of a particle leaving the random-number-generating element;

wherein the first particle is capable of activating the detection apparatus so as to detect the second particle and associate a numerical value with the second particle, the second particle being influenced by the random-number-generating element.

2. The random-number generator as recited in claim 1 wherein the random number is represented in binary form.

3. The random-number generator as recited in claim 1 wherein the numerical value is represented in binary form.

4. The random-number generator as recited in claim 1 wherein the particle source includes a photon-pair source for simultaneously generating two photons with correlated polarization, energy and spatial emission distribution, the two photons being the first and second particles.

5. The random-number generator as recited in claim 4 wherein the detection apparatus employs a single-photon receiver for detecting the activating trigger photon of the photon pair.

6. The random-number generator as recited in claim 1 wherein the random-number-generating element includes a beam splitter having outputs associated with two receivers for detecting single photons.

7. The random-number generator as recited in claim 6 wherein the detection apparatus employs a single-photon receiver for detecting the activating trigger photon of the photon pair.

8. The random-number generator as recited in claim 1 wherein the detection apparatus includes combined coincidence/anticoincidence electronics.

9. The random-number generator as recited in claim 1 wherein the random-number-generating element includes a polarizing beam splitter.

10. The random-number generator as recited in claim 9 wherein the random-number-generating element includes an upstream $\lambda/2$ retardation plate for adjusting the overall splitting ratio.

11. The random-number generator as recited in claim 19 wherein the polarizing beam splitter and the $\lambda/2$ retardation plate are jointly held in positions aligned with respect to each other.

12. The random-number generator as recited in claim 1 wherein the random-number-generating element includes a nonpolarizing beam splitter.

13. The random-number generator as recited in claim 12 wherein the nonpolarizing beam splitter includes a metallized plate and/or a dielectric layer.

14. The random-number generator according to claim 12 further comprising detection electronics and adjustable masks and/or tunable spectral filters disposed in outputs of the beam splitter so as to balance an optical path and the detection electronics.

15. The random-number generator as recited in claim 1 wherein an overall splitting ratio between individual outputs of the random-number-generating element is set by optical and/or electronic apparatuses to an approximately equal splitting ratio.

16. The random-number generator as recited in claim 1 wherein the splitting ratio is 50:50 for two-photon emission.

* * * * *